(12) United States Patent
Lerner et al.

(10) Patent No.: US 8,448,101 B2
(45) Date of Patent: May 21, 2013

(54) LAYOUT METHOD FOR VERTICAL POWER TRANSISTORS HAVING A VARIABLE CHANNEL WIDTH

(75) Inventors: Ralf Lerner, Erfurt (DE); Wolfgang Miesch, Frankfurt (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 920 days.

(21) Appl. No.: 12/091,575

(22) PCT Filed: Oct. 25, 2006

(86) PCT No.: PCT/EP2006/067774
§ 371 (c)(1),
(2), (4) Date: Sep. 5, 2008

(87) PCT Pub. No.: WO2007/048812
PCT Pub. Date: May 3, 2007

(65) Prior Publication Data
US 2009/0007046 A1    Jan. 1, 2009

(30) Foreign Application Priority Data
Oct. 27, 2005 (DE) .......................... 10 2005 051 417

(51) Int. Cl.
*G06F 17/50* (2006.01)
*H01L 29/10* (2006.01)
*H01L 29/94* (2006.01)
*H01L 29/788* (2006.01)
*H01L 29/66* (2006.01)

(52) U.S. Cl.
USPC .................. 716/55; 716/51; 716/52; 716/54; 716/133; 716/139; 257/48; 257/296; 257/315; 257/316; 257/329

(58) Field of Classification Search ............ 716/51, 716/52, 54, 133, 139; 257/48, 296, 315, 316, 257/329, 330, 337
See application file for complete search history.

(56) References Cited

U.S. PATENT DOCUMENTS

| 4,914,058 A | 4/1990 | Blanchard |
| 5,078,498 A * | 1/1992 | Kadakia et al. ............... 257/330 |
| 5,651,235 A | 7/1997 | Ashley et al. |
| 5,763,914 A | 6/1998 | Hshieh et al. |

(Continued)

FOREIGN PATENT DOCUMENTS

DE    10 2004 048 278 B3    6/2006

OTHER PUBLICATIONS

Kumar et al.; "Analysis and design of vertical N-channel IGBT"; Publication Year: 1998; Semiconductor Electronics, 1998. Proceedings. ICSE '98. 1998 IEEE International Conference on; pp. 235-239.*

(Continued)

*Primary Examiner* — Helen Rossoshek
(74) *Attorney, Agent, or Firm* — Hunton & Williams LLP

(57) ABSTRACT

The invention relates to a simulation and/or layout process for vertical power transistors as DMOS or IGBT with variable channel width and variable gate drain capacity which can be drawn and/or designed by the designer with the respectively desired parameters of channel width and gate drain capacity and the parameters of volume resistance and circuit speed, which are correlated therewith, and whose electrical parameters can be described as a function of the geometrical gate electrode design. Here, both discrete and integrated vertical transistors may be concerned.

5 Claims, 4 Drawing Sheets

U.S. PATENT DOCUMENTS

Figure 1:
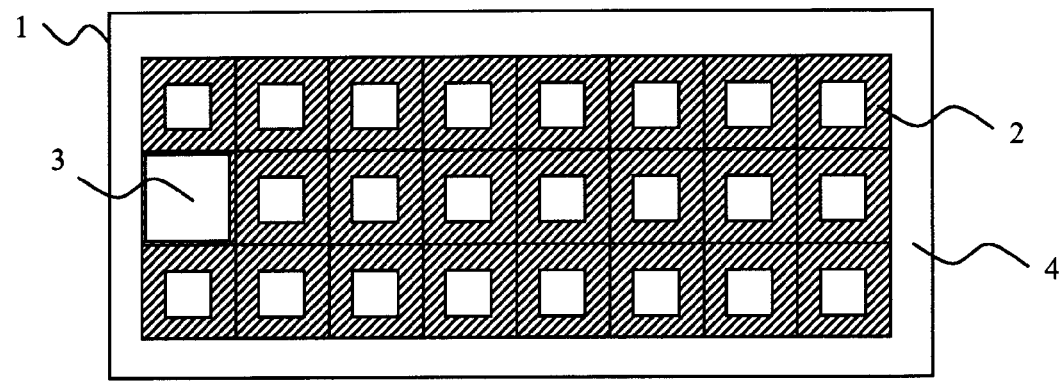

| Patent No. | | Date | Inventor(s) | Class |
|---|---|---|---|---|
| 5,780,324 A | * | 7/1998 | Tokura et al. | 438/138 |
| 5,844,277 A | | 12/1998 | Hshieh et al. | |
| 5,995,734 A | * | 11/1999 | Saika | 716/52 |
| 6,072,216 A | | 6/2000 | Williams et al. | 257/339 |
| 6,433,382 B1 | * | 8/2002 | Orlowski et al. | 257/315 |
| 6,515,325 B1 | * | 2/2003 | Farnworth et al. | 257/296 |
| 6,591,408 B1 | | 7/2003 | Asahina | |
| 6,651,236 B2 | | 11/2003 | Ichimiya et al. | |
| 6,665,849 B2 | * | 12/2003 | Meuris et al. | 716/134 |
| 6,709,934 B2 | * | 3/2004 | Lee et al. | 438/287 |
| 6,724,025 B1 | * | 4/2004 | Takashima et al. | 257/288 |
| 6,734,494 B2 | * | 5/2004 | Ohtani | 257/330 |
| 6,735,742 B2 | * | 5/2004 | Hatsch et al. | 716/119 |
| 6,769,007 B2 | | 7/2004 | Sutherland et al. | |
| 6,821,843 B1 | * | 11/2004 | Chen et al. | 438/243 |
| 6,858,893 B2 | * | 2/2005 | Ishibashi | 257/302 |
| 6,870,221 B2 | | 3/2005 | Venkatraman | |
| 6,939,763 B2 | * | 9/2005 | Schlosser et al. | 438/253 |
| 7,235,448 B2 | * | 6/2007 | Ahn et al. | 438/287 |
| 7,262,109 B2 | * | 8/2007 | Lin et al. | 438/405 |
| 7,268,045 B2 | * | 9/2007 | Hower et al. | 438/282 |
| 7,322,015 B2 | * | 1/2008 | Liu et al. | 716/136 |
| 7,332,771 B2 | * | 2/2008 | Peake | 257/329 |
| 7,345,343 B2 | * | 3/2008 | Phan et al. | 257/347 |
| 7,825,462 B2 | * | 11/2010 | Tang et al. | 257/330 |
| 7,852,651 B2 | * | 12/2010 | Shiraishi et al. | 363/144 |
| 8,304,843 B2 | * | 11/2012 | Verhulst | 257/402 |
| 2002/0073388 A1 | * | 6/2002 | Orshansky et al. | 716/5 |
| 2005/0012148 A1 | | 1/2005 | Hower et al. | |
| 2005/0148127 A1 | * | 7/2005 | Jung et al. | 438/197 |
| 2005/0184361 A1 | * | 8/2005 | Sasaki | 257/565 |
| 2005/0218489 A1 | * | 10/2005 | Satou et al. | 257/678 |
| 2006/0271888 A1 | * | 11/2006 | Meuris et al. | 716/4 |
| 2007/0238318 A1 | * | 10/2007 | Hsu et al. | 438/780 |
| 2007/0285543 A1 | * | 12/2007 | Uchida | 348/294 |
| 2008/0048186 A1 | * | 2/2008 | Cheng et al. | 257/48 |
| 2008/0173928 A1 | * | 7/2008 | Arai et al. | 257/316 |
| 2008/0197406 A1 | * | 8/2008 | Parthasarathy et al. | 257/329 |
| 2008/0243443 A1 | * | 10/2008 | Lerner et al. | 703/1 |
| 2009/0207649 A1 | * | 8/2009 | Tang et al. | 365/149 |
| 2010/0141229 A1 | * | 6/2010 | Satou et al. | 323/282 |
| 2010/0295124 A1 | * | 11/2010 | Lerner | 257/337 |

OTHER PUBLICATIONS

International Search Report for PCT/EP2006/067774 mailed Feb. 19, 2007, 3 pages.

Gilles Fourneris, at al. Demosthenes A Technoology-Independent Power DMOS Layout Generator, IEEE, pp. 178-183, (1999).

J. B. Baliga, Power Semiconductor Devices, PWS Publishing Co., pp. 367-372, (1995).

* cited by examiner

LAYOUT METHOD FOR VERTICAL POWER TRANSISTORS HAVING A VARIABLE CHANNEL WIDTH

FIELD OF THE INVENTION

The present invention relates to vertical power transistors (DMOS or IGBT) with variable channel width and variable gate drain capacity, which may be drawn and/or designed by the designer with the respectively desired parameters of channel width and gate drain capacity and the parameters of volume resistance and circuit speed, which are correlated therewith, and whose electrical parameters can be described as a function of the geometric gate electrode design. They may be both discrete and integrated vertical transistors.

DESCRIPTION OF THE PRIOR ART

A vertical transistor used in power electronics customarily consists of a plurality of individual transistor cells that are connected in parallel with source contact and gate, a connection contact for the gate electrode and an edge structure surrounding the complete transistor, as it is e.g. also described in U.S. Pat. No. 5,844,277, FIGS. 2A to D and FIGS. 5 to 7, and also in U.S. Pat. No. 5,763,914.

With reference to FIGS. 1[1] the previously described power transistor and the corresponding process for designing the transistor are described.

[1] translator's note: here something is missing.

FIG. 1 schematically shows a top view of a vertical power transistor 1. The transistor 1 has a plurality of individual transistor cells 2 that are connected in parallel, an edge area 4 enclosing the individual transistor cells and a common gate connection 3 for all individual transistor cells 2.

Figure 2:
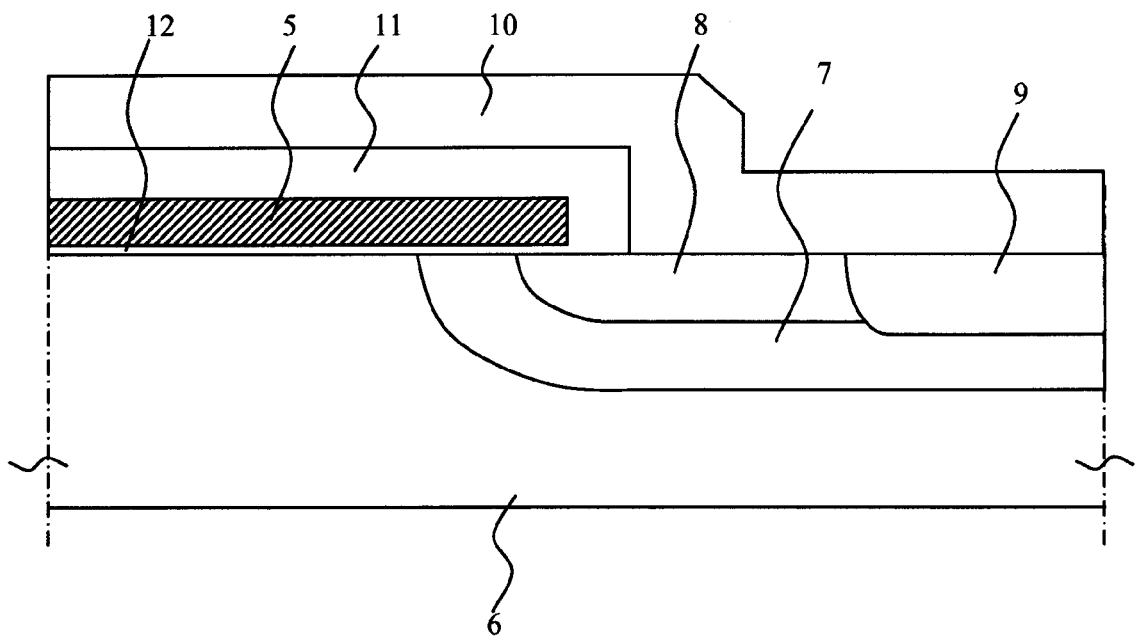

FIG. 2 schematically shows a cross-section through an individual transistor cell 2 of the transistor 1. The common gate connection 3 (cf. FIG. 1) is connected with a gate electrode 5 which is jointly provided in all individual transistor cells 2 and which is customarily made of polysilicon. Moreover, a common drain connection 6 is shown which is formed on the rear side of the corresponding substrate, for instance a silicon wafer. Each individual transistor cell 2 has a separate well 7 with a doping type opposed to the that of the drain area, a source area 8 with a doping type corresponding to that of the drain area and a highly doped well connection 9 whose doping type again corresponds to the well doping 7. The source area 8 and the well connection are electrically connected by means of a common metal electrode 10. Here, the gate electrode 5 is electrically insulated from the metal electrode 10 by an insulator layer 11. The gate electrode 5 is insulated from the drain area 6, the well area 7 and the source 8 by a gate dielectric 12 which is e.g. formed from silicon dioxide.

Figure 3:
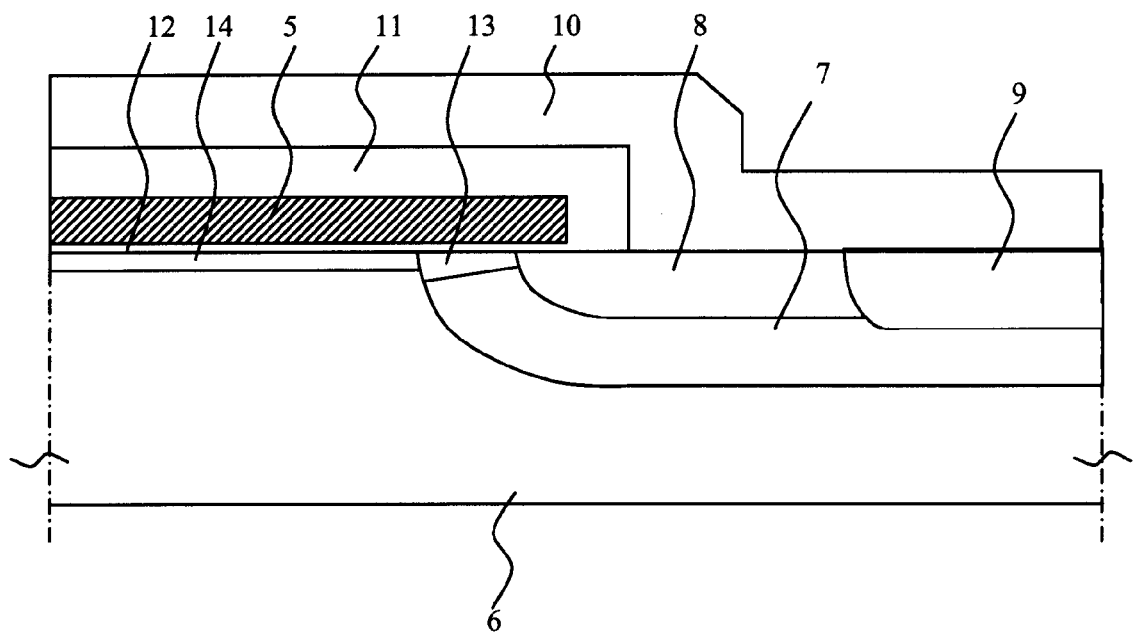

With reference to FIG. 3 the functioning of the transistor 1 and/or an individual transistor cell 2 is described.

By applying a defined voltage to the gate electrode 5 an inversion layer 13 is formed below the gate oxide and/or the gate dielectric 12 in the area of the well 7. This inversion layer 13 forms a conductive channel between the source 8 and the drain 6. At the same time, an enrichment or accumulation layer 14 is formed in the area above the drain 6 below the gate oxide and/or the gate dielectric 12, in which current flows from the source 8 through an area between the wells 7, which diminishes the current supply as a function of the distance of the wells 7 of the individual transistor cells 2, into the drain 6.

The number and size of the individual transistor cells 2 is decisive for the transistor surface, the channel width and the volume resistance of the transistor 1 as this is also described in Baliga, Power Semiconductor Devices, 1995, pages 357 et seq.

Methods are known for designing integrated circuits, in order to put together the circuit from individual blocks. In U.S. Pat. No. 6,769,007 a putting together of an integrated circuit from individual blocks is described. Likewise the making up of an integrated circuit or parts thereof from individual blocks to be especially connected with metallic strip conductors is described in U.S. Pat. Nos. 5, 651,235 and 6,591,408.

DE-A 10 2004 048278 shows a process, in which the active surface of the power transistor is composed of individual segments.

Figure 4:
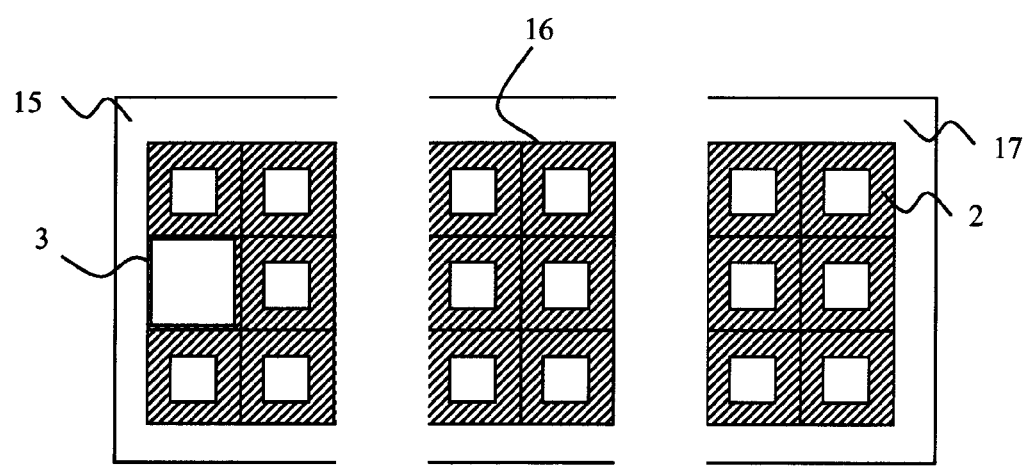

FIG. 4 shows a corresponding procedure for the putting together of a transistor design during the planning phase. For the sake of simplicity the individual components of the transistor design with which a complete design of a transistor is to be composed, are also designated with the corresponding components of a real transistor and the reference numerals previously introduced are used.

Due to the use of a first end piece 15 which contains i.a. the gate connection electrode 3, of a second end piece 17 and of a central piece 16 a transistor, i.e. its design, can be put together. The active surface and/or the channel width is determined by the number of the segments, in particular by the number of the central pieces 16. Thus, however, the volume resistance for this transistor is determined. The electrical parameters can be described as a function of the channel width and/or the number of the used segments.

The thickness of the gate oxide and/or the gate dielectric 12 and the surface of the gate electrode 5 determine i.a. the gate drain capacity, which, in turn, is included in the input capacity of the transistor. A large surface of the gate electrode 5 in connection with a small thickness of the gate dielectric 12 results e.g. in a high drain gate capacity. However, the circuit speed and the switching losses are influenced by the charging and discharging process of the input capacity, as it is also described in B. J. Ealiga, Power Semiconductor Devices, 1995, pages 381 et seq.

U.S. Pat. No. 6,870,221 is a process by means of which the gate drain capacity can be reduced by a thicker gate oxide with a length in the area outside the channel areas.

Figure 5:
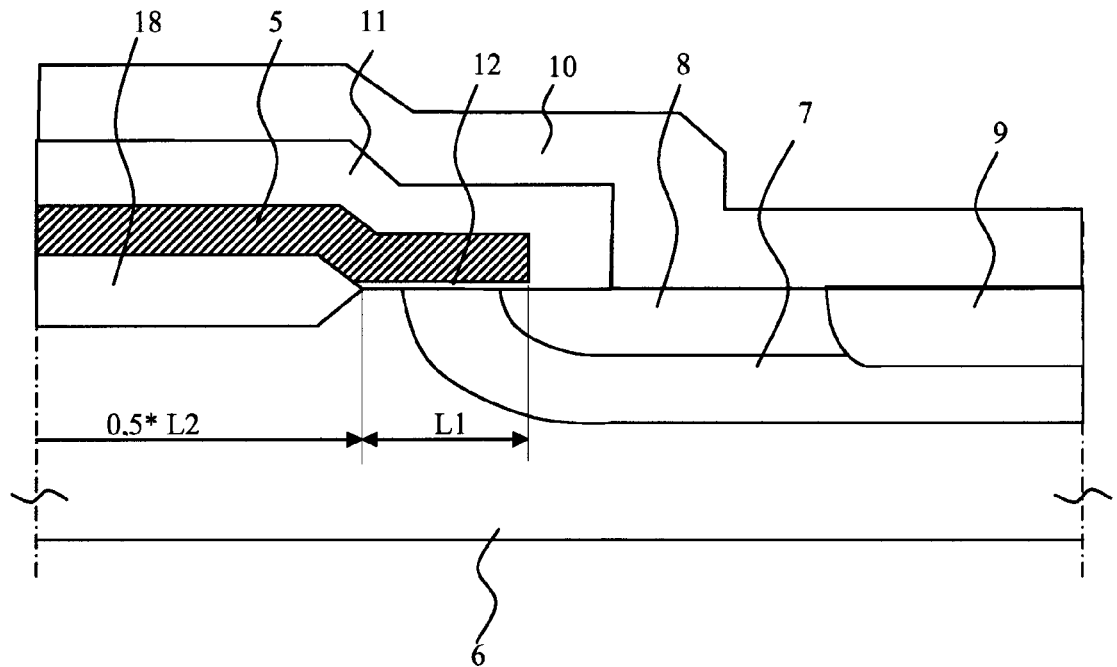

FIG. 5 shows a corresponding design: a gate dielectric with a length L2 and a larger thickness 18 as compared with the gate dielectric 12 is provided in an area, in which there is no channel area. I.e. the "thin" gate dielectric 12 which is provided with a length L1 smaller than L2 provides for a good capacitive coupling in the area between source and drain to generate the inversion layer 13 (cf. FIG. 3), if a control voltage is applied to the gate electrode 5. On the other hand, a small capacitive coupling between drain and gate electrode 5 is caused by the thick gate dielectric 18. However, this takes place at the expense of the volume resistance, since, due to the thicker oxide 18, the accumulation layer 14 (cf. FIG. 3) in this area between the channel areas is prevented or at least reduced. Thus, the reduction of the gate drain capacity takes place at the expense of the volume resistance. In order to improve the circuit speed, the volume resistance being the same, an enlargement of the active surface of the transistor is necessary.

In order to obtain the desired relationship of the parameters gate of drain capacity and/or circuit speed, on the one hand, and volume resistance, on the other hand, of a vertical DMOS transistor, the size of the active surface and/or the required channel width as well as the length L2 of the thicker gate oxide 18 must be recalculated in the present prior art, the corresponding layout must be designed and the formed transistor must be recharacterized in the present prior art. This means that a considerable expenditure is involved in order to obtain a transistor 2 with adapted parameters of drain gate capacity and volume resistance from the transistor 1 with a first set of parameters, since customarily the required electric parameters of the vertical DMOS transistor are separately measured and described for each different transistor.

OVERVIEW OF THE INVENTION

It is the object of the invention to indicate a process with which vertical power transistors with optimized parameters of gate drain capacity and channel width can be designed in a simplified fashion.

Under one aspect the present object is attained by a process for designing and/or simulating of vertical power transistors, wherein the channel width and the gate drain capacity can be efficiently adjusted and calculated on a design plane.

In the process for simulating and/or designing vertical power transistors the design of a power transistor is composed of different partial design parts, which include a first end piece with a gate connection, at least one central piece and a second end piece with an edge structure.

Each partial design piece corresponds to a design structure with several individual transistor cells, each individual transistor cell being defined by design parameters. They describe at least a thickness of a gate dielectric and its design length.

Moreover, the process comprises the provision of several design structures for each of the partial pieces, each corresponding to at least one individual transistor cell. Each design structure is defined by a first partial gate dielectric piece with a first length and a first thickness and a second partial gate dielectric piece with a second length and a second thickness, which is larger than the first thickness. At least the ratio of first length to second length is different at least for a few of the design structures, the total length being the same.

Moreover, the process comprises the putting together of a transistor design from the partial pieces and a calculation of at least the capacity of the transistor resistance as a function of the first and second lengths of the used design structures.

Thus, a simplification of the design of a vertical power transistor with a specific gate drain capacity in the case of a specific volume resistance and the reduction of the expenditure for measurements and description can be achieved.

Thus, a "preliminary design" is made available to the designer, which he or she can correspondingly redesign in a simple and rapid fashion in accordance with his or her needs. Due to the provision of individual transistor cells as design sizes, which have the varying ratios of the different areas of the gate dielectrics the prerequisite is in particular created to adjust and/or calculate essential properties of the transistor (the input capacity and the volume resistance from the available parameter values).

Thus, the connection between the effective length of the thick gate dielectric and thus the effective length of the thin gate dielectric and the channel resistance can be directly represented and varied in a simple fashion.

In further advantageous embodiments possible solutions for adapting different total lengths for the thin and the thick gate dielectric are indicated, wherein the length ratios in the individual partial pieces may be the same, but may vary from partial piece to partial piece or are changed within an individual partial piece. Possibilities of the surface gradation for transistor designs and for the specification of the exact structure of the actual transistors are offered.

A further advantageous embodiment can achieve the aforementioned advantages of an efficient and flexible design procedure. Moreover, a method for the parametric description of the viewed components is thus also indicated. Corresponding variants of this are represented in the claims referred thereto.

SHORT DESCRIPTION OF THE DRAWINGS

The invention is illustrated by means of examples with the aid of the drawing.

Figure 6:
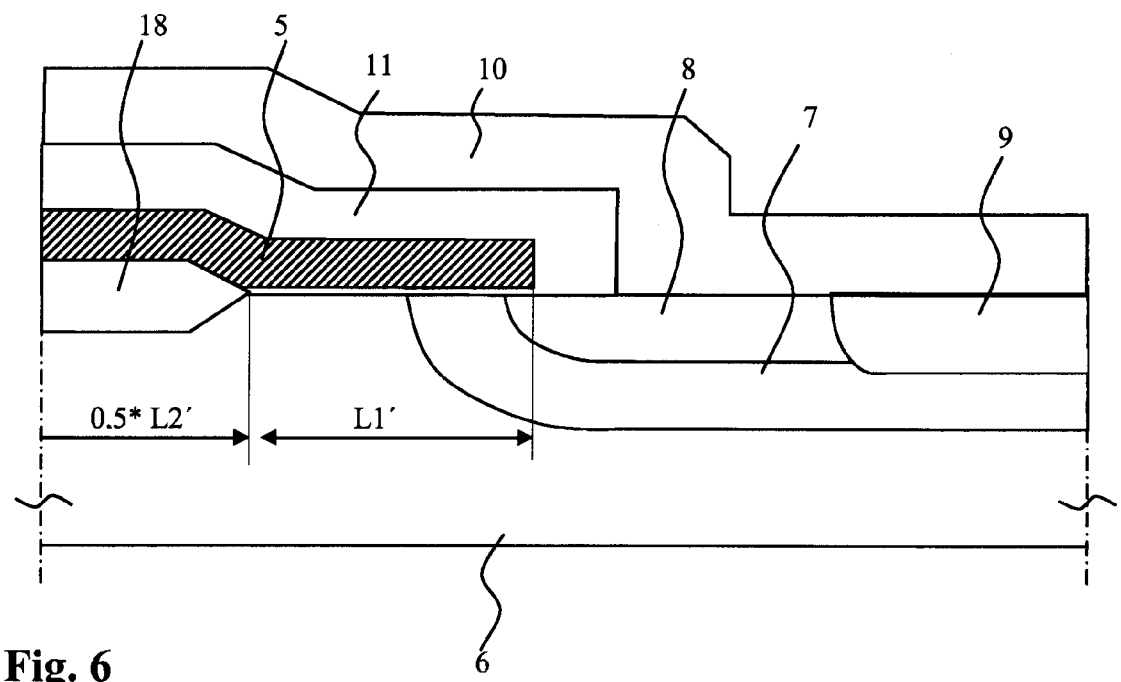
Figure 7:
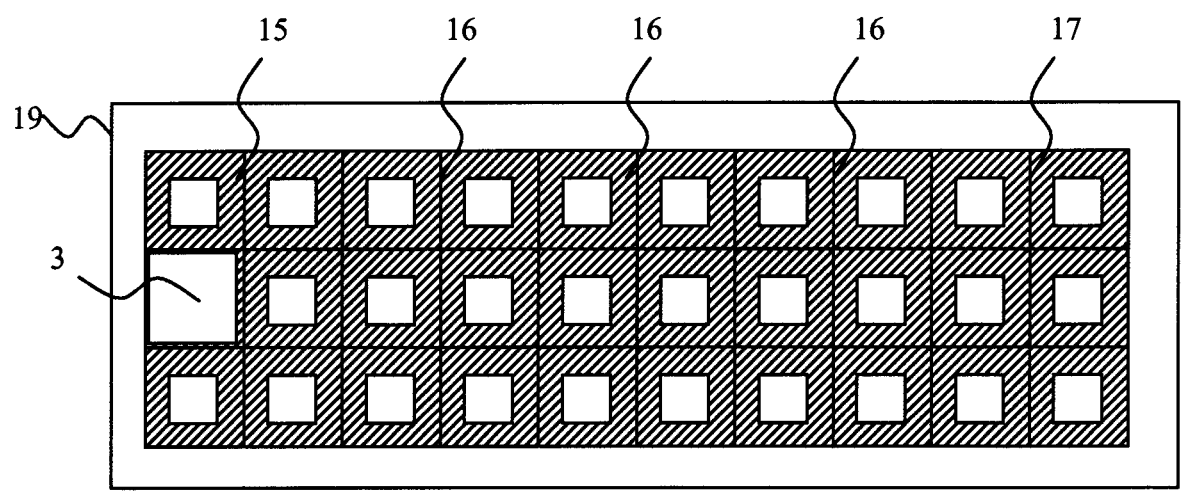

FIG. 1 schematically shows the top view of a vertical power transistor;

FIG. 2 schematically shows a section through a customary power MOSFET;

FIG. 3 schematically shows a section through a customary power MOSFET in the switched on state;

FIG. 4 schematically shows individual segments of the divided transistor of FIG. 1;

FIGS. 5 and 6 schematically show transistor elements with thick gate oxide layer of different expansion;

FIG. 7 schematically shows a transistor that was put together including the elements shown in FIG. 5 and 6 as an example of the invention.

DETAILED DESCRIPTION OF THE INVENTION AND ITS EXAMPLES

Now further embodiments of the invention are described with reference to FIGS. 1 to 7, wherein for the sake of simplicity components of actual transistors and their corresponding design structures are indicated with the same reference numerals.

FIG. 6 schematically shows how in the present invention an optimizing of the gate drain capacity, on the one hand, and of the volume resistance, on the other hand, are achieved by means of a reduction of the length L2 (cf. FIG. 5) to L2' of the thick gate oxide 18, i.e. of a part of the gate dielectric, with a simultaneous enlargement of the length L1 (cf. FIG. 5) of the gate oxide 12 with small or "normal" thickness" by the same measure. The transistor structure with the measurements L1' and L2' that was formed therefrom is with its parameters of volume resistance and gate drain capacity between the transistors shown in FIG. 2 and 5.

According to the invention various elements and/or design structures are provided for each of the partial pieces 15, 16 and 17 which include the thick partial piece of the gate oxide or the gate dielectric 18 with respectively different lengths and, accordingly, also have different lengths for the thin partial piece of the gate dielectric 12 so that the length ratio from the length of the thin partial piece to the length of the thick partial piece is also different, the total length being otherwise constant.

FIG. 7 schematically shows an assembled transistor 19 with the corresponding first end piece 15, a specific number of central pieces 16 and the second end piece 17. Now, the parameters of the assembled transistor 19 may be calculated from the known parameters of the individual pieces. The provision of the different design structures with the different length ratios offers a high degree of flexibility in the adjustment of the drain gate capacity and the volume resistance, it being possible to calculate and also simulate the design values for these parameters as a function of the corresponding lengths.

In the shown example the surface of the transistor 19 is composed of the surface of the two end pieces 15 and 17 and the triple surface of the central piece 16. The surface of the transistor can almost optionally be enlarged by inserting further central pieces 16.

The size of the central piece 16 determines the length of the steps of the possible surface gradations, i.e. rough gradations of the surface can be achieved with large central pieces 16. Whereas with small central pieces 16 finer gradations can be achieved. Here, the size of the individual transistor cell determines the minimally possible size of the central piece 16, i.e. if only a single individual transistor cell 2 is provided in the central piece 16 the minimum size is determined by exactly the cell size. The gradation of the lengths of the thin part 12 of the gate dielectric and/or the lengths of the thick partial piece 18 of the gate dielectric may be implemented within finished segments or, however, continuously. The description of the parameters of gate drain capacity and resistance is accordingly effected in a gradated fashion or as a description as a function of the lengths L1, L2.

In a concrete embodiment of the simulation and/or layout process for vertical power transistors with variable channel width and variable gate drain capacity it is proceeded as follows: the transistor design is put together from different partial pieces, namely a first end piece 15, which e.g. also contains the gate connection 3, at least one central piece 16 and a second end piece 17 with an edge structure 4 surrounding the complete transistor, each of these partial pieces consisting of a plurality of individual transistor cells 2 with source contact and gate, which are connected in parallel, and the individual transistor cells 2 having a common gate electrode 5 which customarily consists of polysilicon and a common drain connection 6 on the rear side of the silicon wafer and each individual transistor cell having a separate well 7 with a doping type that is opposite to that of the drain area, a source area 8 with a doping type corresponding to that of the drain area and a highly doped well connection 9 whose doping type corresponds again to the well doping and source area 8 and well connection being electrically connected by a common metal electrode 10 and the gate electrode 5 being electrically insulated from the insulator layer 11 from the metal electrode 10 and the gate electrode 5 being insulated from the drain area 6, the well area 7 and the source 8 by a gate dielectric with two partial pieces 12, 18 which customarily consist of silicon dioxide. A certain number of different individual transistor cells 2 is provided for each of these partial pieces which include the thick gate dielectric 18 and thus also the thin gate dielectric 12 with respectively different lengths so that the parameters of the assembled transistor 19 are calculated from the known parameters of the individual pieces in such a way that the surface A of the transistor results as $$A_{transistor} = A_{end\ piece15} + A_{end\ piece17} + X \ast A_{central\ piece16}$$

the capacity C of the transistor results as $$C_{transistor} = C_{end\ piece15} + C_{end\ piece17} + X \ast C_{central\ part16}$$

wherein the capacities of the different individual segments result as a function of the variable lengths L1 and L2 of the thin and/or thick gate oxide 12, 18:

$$C_{end\ piece15} = f(L1, L2)$$

$$C_{end\ piece17} = f(L1, L2)$$

$$C_{central\ piece16} = f(L1, L2)$$

and the resistance of the transistor results as $$1/R_{transistor} = 1 R_{end\ piece15} + 1/R_{end\ piece17} + X \ast 1/R_{central\ piece16},$$

wherein the respective resistance of the individual segments is described as a function of the lengths of the thick gate oxide 18 and/or the thin gate oxide 12 and the size of the central piece 16 determines the step length of the possible surface gradations.

Transistors with parameters of volume resistance and gate drain capacity, which are adapted to the requirements of the use, can be designed in a simple (and thus in a rapid and inexpensive) fashion with the described process. Due to the indicated calculation processes of individual transistor parameters from given parameters of the individual pieces a description of the designed transistors on the basis of the starting pieces is possible.

List of Reference Numerals

1: vertical power transistor
2: individual cells connected in parallel
3: gate connection contact
4: edge structure
5: gate polysilicon
6: drain
7: well
8: source connection
9: well connection
10: source metal electrode
11: insulator layer
12: gate dielectric/gate oxide and/or thin part of the gate dielectric
13: inversion layer, channel
14: enrichment or accumulation layer
15: first end piece of a divided transistor with gate connection electrode
16: central piece of a divided transistor
17: second end piece of the divided transistor
18: thick part of the gate dielectric and/or the gate oxide layer
19: transistor put together from individual elements

What is claimed is:

1. A device for designing vertical power transistors, the device comprising:
 a plurality of different partial design pieces so as to include a first end piece with a gate connection at least one central piece and a second end piece and an edge structure each partial design piece comprising at least one individual transistor cell, each individual transistor cell being defined by design parameters representing at least a thickness of a gate dielectric and a design length thereof;
 several design structures for each of said plurality of different partial design pieces, each design structure corresponding to a respective one of said different partial design pieces comprising said at least one individual transistor cell, each design structure being defined by a first partial gate dielectric piece having a first length and a first thickness and by a second partial gate dielectric piece having a second length and a second thickness, said second thickness being larger than the first thickness, said first length and said second length being variables, a ratio of the first length to said second length being different and while a total length of said first and second lengths being is constant for at least some of the design structures;
 whereby a transistor design of a vertical power transistor is put together from said plurality of partial design pieces; and allowing at least a capacity calculation and a transistor resistance determination as a function of the first and second lengths.

2. The device according to claim 1, wherein putting together the transistor design comprises applying design structures so as to have the same ratio of first length to second length within a single partial piece, and using a different ratio in at least two different partial pieces.

3. The device according to claim 1, wherein putting together the transistor design comprises
design structures of different ratios of first length to second length within a single partial piece.

4. The device according to claim 1, wherein the vertical power transistor and individual transistor cells contained therein have a source contact and a gate, wherein
the individual transistor cells having a common gate electrode and a common drain connection on a rear side of a silicon wafer;
and each individual transistor cell has a separate well with a doping type that is opposed to a doping type of a drain area, a source area with a doping type corresponding to the doping type of a drain area and a highly doped well connection corresponding to the doping type of the well doping and the source area and the well connection electrically connected by a common metal electrode and the gate electrode electrically insulated from the metal electrode by an insulator layer and the gate electrode insulated from the drain area;
the well area and the source by a gate dielectric corresponding one of the gate dielectric partial pieces.

5. The device according to claim 1, further comprising
a transistor design of at least one further vertical power transistor from said plurality of design pieces, to adjust a surface gradation of said transistor design of said vertical power transistor and said at least one further vertical power transistor by stipulating a size of each of several central pieces for said transistor designs.

* * * * *

UNITED STATES PATENT AND TRADEMARK OFFICE
CERTIFICATE OF CORRECTION

PATENT NO.        : 8,448,101 B2  
APPLICATION NO.   : 12/091575  
DATED             : May 21, 2013  
INVENTOR(S)       : Lerner et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1160 days.

Signed and Sealed this
Eighth Day of September, 2015

Michelle K. Lee
*Director of the United States Patent and Trademark Office*